(12) United States Patent
Akiyama (10) Patent No.: US 9,436,022 B2
(45) Date of Patent: Sep. 6, 2016

(54) MODULATED LIGHT SOURCE

(71) Applicant: FUJITSU LIMITED, Kawasaki-shi, Kanagawa (JP)

(72) Inventor: Tomoyuki Akiyama, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/730,471

(22) Filed: Jun. 4, 2015

(65) Prior Publication Data

US 2015/0355482 A1 Dec. 10, 2015

(30) Foreign Application Priority Data

Jun. 5, 2014 (JP) ................................. 2014-117046

(51) Int. Cl.
| | |
|---|---|
| *H01S 3/063* | (2006.01) |
| *H01S 5/14* | (2006.01) |
| *G02F 1/025* | (2006.01) |
| *H01S 3/107* | (2006.01) |
| *H01S 5/0687* | (2006.01) |
| *H01S 3/082* | (2006.01) |
| *H01S 3/106* | (2006.01) |
| *H01S 3/108* | (2006.01) |
| *H01S 5/024* | (2006.01) |
| *H01S 5/40* | (2006.01) |

(52) U.S. Cl.
CPC .............. *G02F 1/025* (2013.01); *H01S 3/107* (2013.01); *H01S 5/0687* (2013.01); *H01S 5/142* (2013.01); *G02F 2201/58* (2013.01); *G02F 2203/055* (2013.01); *H01S 3/0826* (2013.01); *H01S 3/106* (2013.01); *H01S 3/108* (2013.01); *H01S 5/02446* (2013.01); *H01S 5/4062* (2013.01); *H01S 5/4068* (2013.01); *H01S 5/4087* (2013.01)

(58) Field of Classification Search
None
See application file for complete search history.

(56) References Cited

U.S. PATENT DOCUMENTS

| | | | | |
|---|---|---|---|---|
| 8,837,548 | B2* | 9/2014 | Tanaka .................. | H01S 5/0687 372/50.11 |
| 2004/0258360 | A1* | 12/2004 | Lim et al. .............. | B82Y 20/00 385/43 |
| 2009/0092159 | A1 | 4/2009 | Kato | |
| 2009/0225801 | A1* | 9/2009 | Mori et al. .......... | H01L 33/0045 372/29.011 |
| 2010/0316074 | A1* | 12/2010 | Fukuda .................. | B82Y 20/00 372/43.01 |
| 2014/0254617 | A1* | 9/2014 | Oh ........................ | H01S 3/1062 372/20 |

FOREIGN PATENT DOCUMENTS

| | | |
|---|---|---|
| JP | 2009-059729 A | 3/2009 |
| JP | 2010-177539 A * | 8/2010 |
| JP | 2012-064862 A | 3/2012 |

* cited by examiner

*Primary Examiner* — Mike Stahl
(74) *Attorney, Agent, or Firm* — Fujitsu Patent Center (57) ABSTRACT

A modulated light source includes: a reflective film which is formed at one end of an optical amplifier; a light wavelength filter which has band-pass characteristics and modulates a transmission center wavelength; a light reflection mechanism which feeds back light having passed through the light wavelength filter to the optical amplifier and an optical resonator is formed between which and the reflective film; and a wavelength adjustment mechanism which adjusts the transmission center wavelength to coincide with a specific oscillation wavelength when light oscillation selectively occurs at the specific oscillation wavelength depending on the band-pass characteristics of the light wavelength filter.

11 Claims, 12 Drawing Sheets

CONDITION: RING RADIUS 5μm, RESONATOR LENGTH 400μm,
WAVELENGTH-TEMPERATURE COEFFICIENT 0.07nm/°C

|  | WAVELENGTH SHIFT AMOUNT | TEMPERATURE INCREASE AMOUNT |
|---|---|---|
| CONVENTIONAL ART | 19nm (RESONANT WAVELENGTH SPACING) | 271°C |
| FIRST EMBODIMENT (MODULATION FILTERING) | 0.8nm (FP MODE SPACING) | 11°C |

GREAT IMPROVEMENT IN RELIABILITY DUE
TO GREAT TEMPERATURE DECREASE

MODULATED LIGHT SOURCE

CROSS-REFERENCE TO RELATED APPLICATION

This application is based upon and claims the benefit of priority of the prior Japanese Patent Application No. 2014-117046, filed on Jun. 5, 2014, the entire contents of which are incorporated herein by reference.

FIELD

The embodiments discussed herein are directed to a modulated light source.

BACKGROUND

Conventionally, development of a small-sized and low power consumption modulated light source has been expected. In such a modulated light source, it has been studied to apply a minute ring modulator using a silicon sub-micron optical waveguide.

Figure 11:
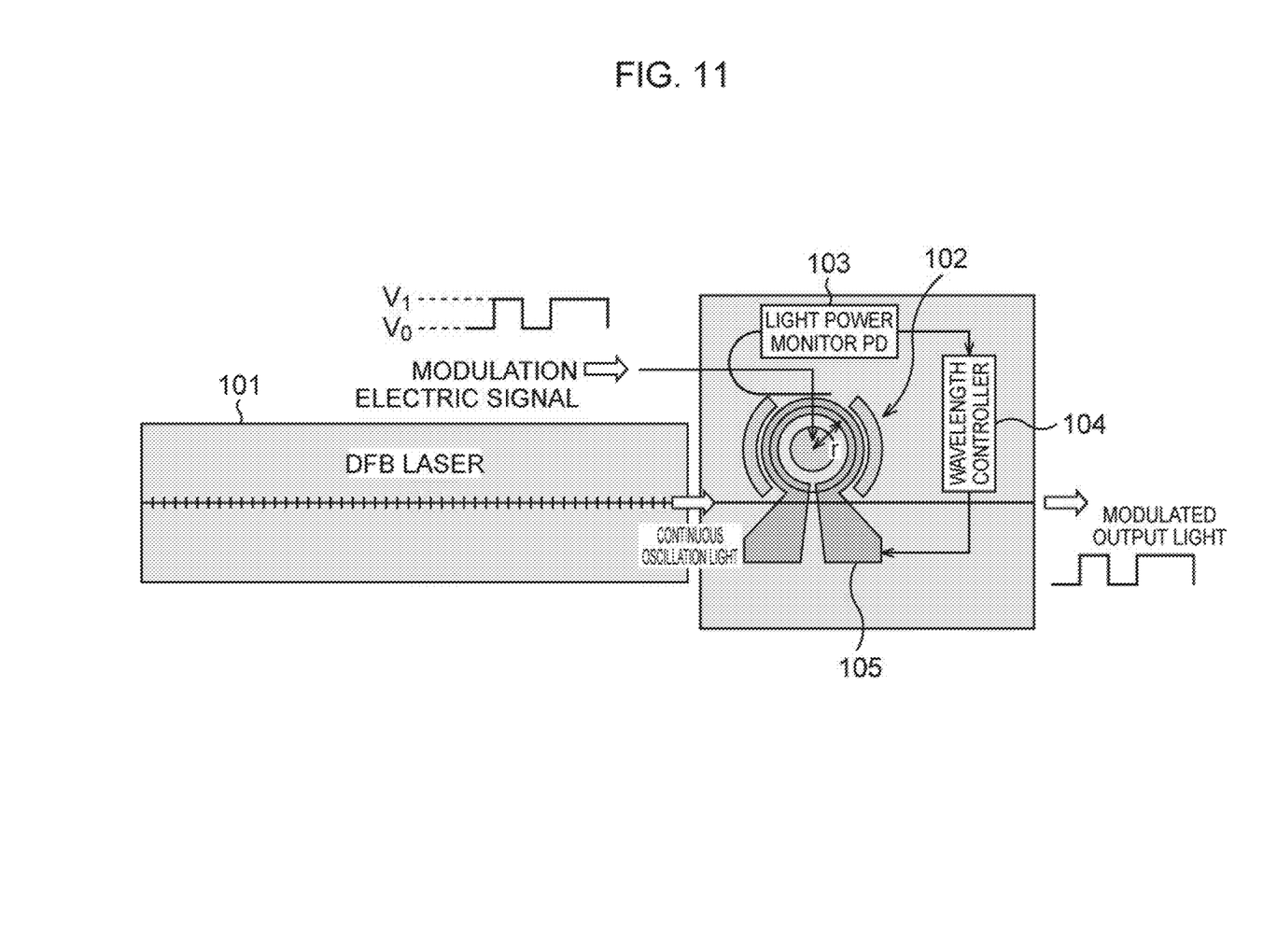
FIG. 11 is a schematic view illustrating a schematic configuration of a conventional modulated light source using a ring modulator.

FIG. 11 is a schematic view illustrating a schematic configuration of a conventional modulated light source using a ring modulator.

This modulated light source is constituted by including a distributed feedback type (DFB) laser 101, a ring modulator 102, a light power monitor PD 103, a wavelength controller 104, and a heater 105.

The light power monitor PD 103 detects a light power passing through the ring modulator 102. The wavelength controller 104 outputs a control signal of a wavelength of laser light based on the light power detected by the light power monitor PD 103. The heater 105 heats the ring modulator 102 according to the control signal of the wavelength controller 104 to adjust the wavelength.

In the modulated light source, the DFB laser 101 continuously oscillates to output laser light. The output laser light passes through an optical waveguide to be guided to the ring modulator 102, and a transmittance is modulated at the ring modulator 102.

At the ring modulator 102, a transmission spectrum thereof is a Lorentzian spectrum whose transmittance becomes the minimum at a resonant wavelength. At the ring modulator 102, a modulation signal is changed between a voltage $V_0$ and a voltage $V_1$ to change the resonant wavelength. The transmittance is thereby modulated, and it is possible to obtain intensity-modulated output light.

[Patent Document 1] Japanese Laid-open Patent Publication No. 2012-64862

[Patent Document 2] Japanese Laid-open Patent Publication No. 2009-59729

Figure 12:
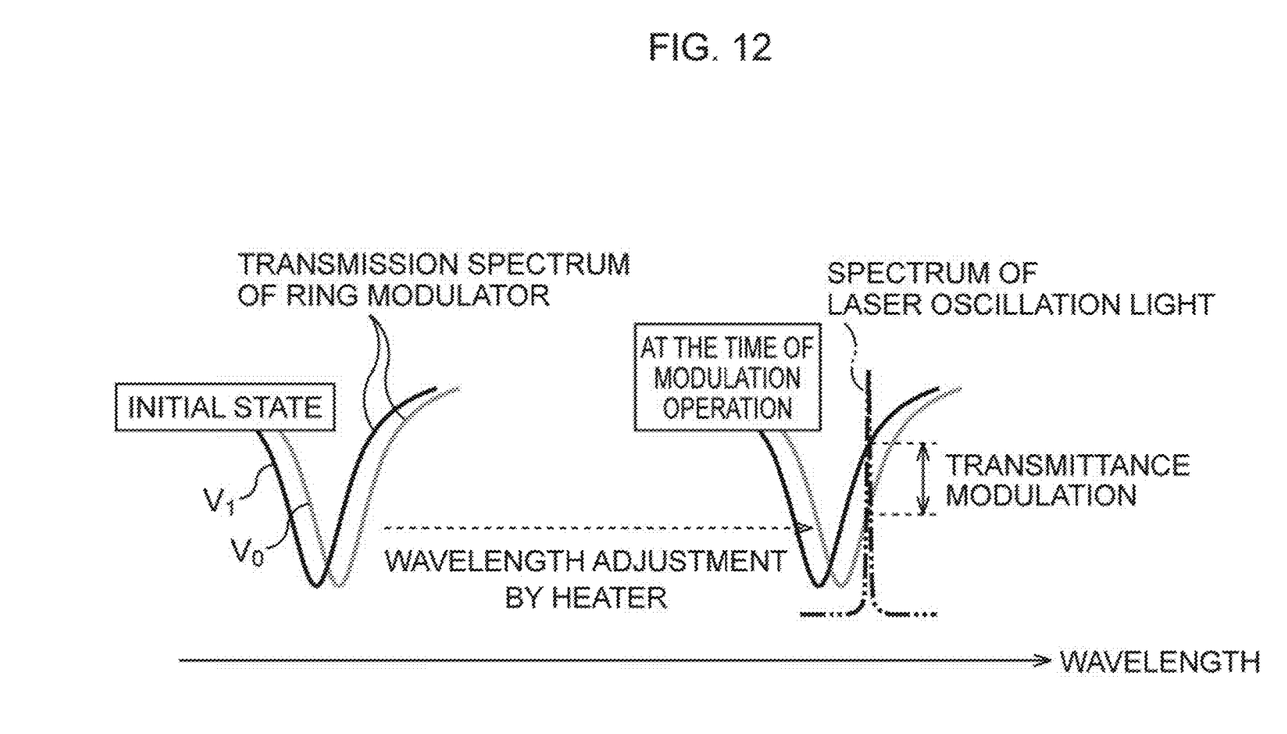
FIG. 12 is a characteristic chart illustrating a state where a resonant wavelength is adjusted by a conventional modulated light source.

The resonant wavelength of the ring modulator 102 varies according to a change of a circumferential optical path length of the ring modulator 102 caused by a fabrication error or a temperature change, and deviation from a wavelength of the oscillated laser light occurs. As illustrated in FIG. 12, the ring modulator 102 is heated by the heater 105 to increase a ring temperature so as to compensate the deviation, and adjustment of the resonant wavelength is performed.

However, in this case, there is a problem in which it becomes difficult to enable both securing reliability of the modulated light source and improving power efficiency of a wavelength adjustment mechanism and a modulation (reduction in a heater power and a modulation power). Reasons thereof are as described below.

Figure 13A:
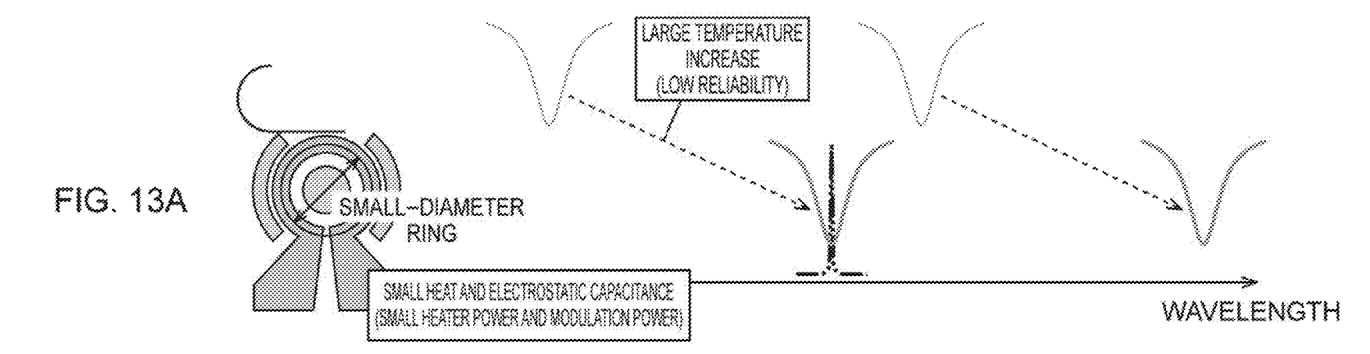
FIG. 13A and FIG. 13B are schematic explanatory charts of problems in the conventional modulated light source.

A case is considered when a radius of the ring modulator is small as illustrated in FIG. 13A. In this case, a volume of the ring modulator becomes small, and the power consumption at the heater which is required to compensate the wavelength deviation at the temperature variation time decreases. Besides, an electrostatic capacitance to be a load of a drive circuit of the ring modulator becomes small, and therefore the modulation power also decreases. On the other hand, when compensation of an initial wavelength deviation is performed, it is necessary to compensate for a degree of a maximum spacing (FSR: free spectral range) of a ring resonant wavelength, and the FSR becomes large. Resulting from the increase in the FSR, the compensation amount of the wavelength increases, and as a result, an increase amount of the temperature of the ring modulator 102 increases to cause lowering of the reliability.

Figure 13B:
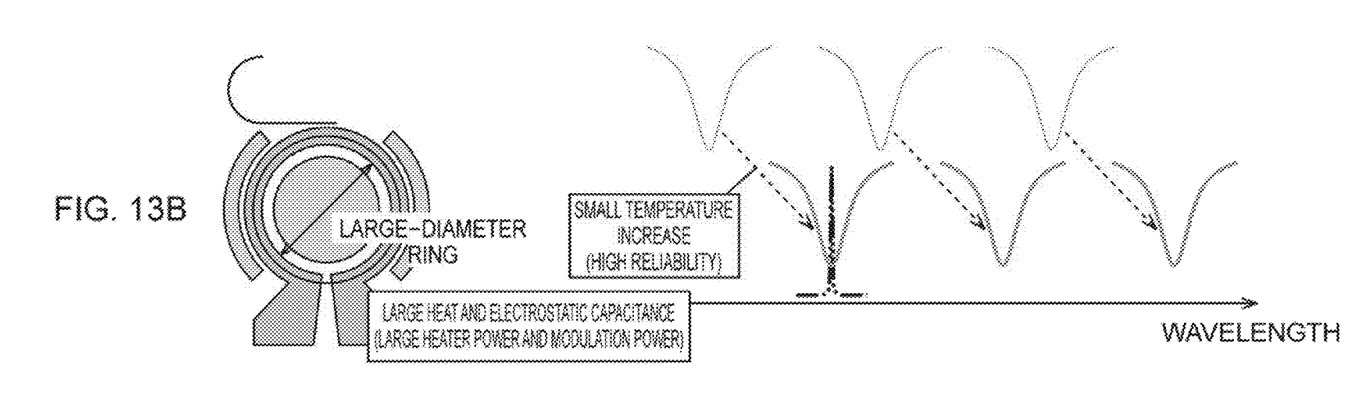

A case is considered when the radius of the ring modulator is large as illustrated in FIG. 13B. In this case, the FSR becomes small, the compensation amount of the wavelength decreases, the increase amount of the temperature of the ring modulator is reduced, and the reliability is secured. On the other hand, the volume of the ring modulator becomes large, and the power consumption at the heater which is required to compensate the wavelength deviation at the temperature variation time increases, further the modulation power increases.

Further, a problem caused by using the DFB laser 101 is not negligible. Namely, if a phase shift of a diffraction grating is eliminated to improve power efficiency of the DFB laser 101, yield is lowered. Conversely, when the phase shift is inserted to improve the yield, the power efficiency drops.

SUMMARY

An aspect of a modulated light source includes: an optical amplifier which includes a reflective film at one end; a light wavelength filter which has band-pass characteristics and modulates a center wavelength of a pass-band; a light reflection mechanism which feeds back light having passed through the light wavelength filter to the optical amplifier and an optical resonator is formed between which and the reflective film; and a wavelength adjustment mechanism which adjusts the pass-band to coincide with a specific oscillation wavelength when light oscillation selectively occurs at the specific oscillation wavelength depending on the band-pass characteristics of the light wavelength filter.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, preferred embodiments of a modulated light source will be explained in detail with reference to the drawings.

First Embodiment

Figure 1:
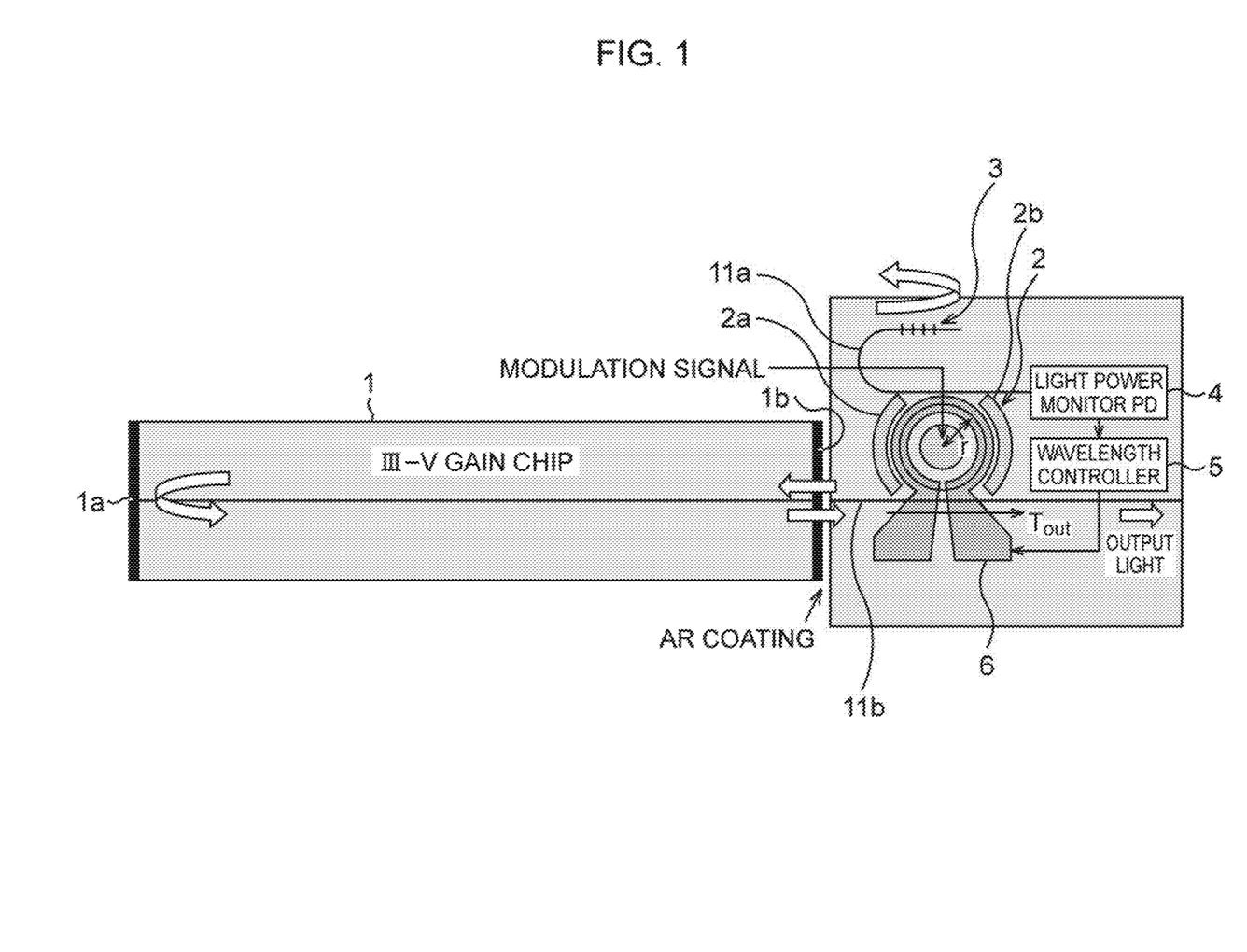
FIG. 1 is a schematic view illustrating a schematic configuration of a modulated light source according to a first embodiment.

FIG. 1 is a schematic view illustrating a schematic configuration of a modulated light source according to a first embodiment.

This modulated light source is constituted by including a gain chip 1 being an optical amplifier, a ring modulator 2 being a light wavelength filter, a distributed Bragg reflector (DBR) mirror 3 being a light reflection mechanism, a light power monitor PD 4 being a detection part of a light power, a wavelength controller 5, and a heater 6.

The gain chip 1 is constituted by, for example, a III-V group semiconductor such as an InP, and a reflective (HR) film 1a is formed at one end, and an anti-reflective (AR) film 1b is formed at the other end.

The ring modulator 2 is a light wavelength filter having band-pass characteristics, and for example, it is constituted by a silicon thin line. There are a P-type doping region and an N-type doping region in a ring-state optical waveguide, and a pair of modulation electrodes 2a, 2b to modulate a resonant wavelength by a modulation signal in accordance with an intensity thereof are disposed. The ring modulator 2 changes a reflective index of the optical waveguide to modulate the resonant wavelength by applying a reverse bias voltage or a forward bias voltage between the P-type doping region and the N-type doping region from the modulation electrodes 2a, 2b.

The ring modulator 2 includes, for example, two kinds of optical waveguides 11a, 11b each constituted by the silicon thin line. In one optical waveguide 11a, the DBR mirror 3 is disposed at one end, and the light power monitor PD 4 is disposed at the other end. In the other optical waveguide 11b, one end is an output port of an optical signal, and the other end is connected (butt-joint connected) to the gain chip 1.

The DBR mirror 3 is formed by a diffraction grating, and is one making light passing through the ring modulator 2 feed back to the gain chip 1 via the other end of the optical waveguide 11b. An optical resonator is formed between the HR film 1a of the gain chip 1 and the DBR mirror 3.

The light power monitor PD 4 detects the power of the light passing through the ring modulator 2.

The wavelength controller 5 outputs a wavelength control signal of a ring modulator based on the light power detected by the light power monitor PD 4.

The heater 6 heats the ring modulator 2 to a predetermined temperature according to the control signal of the wavelength controller 5 to adjust the wavelength.

A wavelength adjustment mechanism which adjusts the resonant wavelength of the ring modulator 2 is formed by including the light power monitor PD 4, the wavelength controller 5, and the heater 6. The wavelength adjustment mechanism adjusts the resonant wavelength to coincide with a specific oscillation wavelength when light oscillation selectively occurs at the specific oscillation wavelength depending on the band-pass characteristics of the ring modulator 2.

In a modulated light source according to the present embodiment, laser oscillations occur in a plurality of Fabry-Perot (FP) modes having a wavelength spacing determined by an optical path length between the HR film 1a of the gain chip 1 and the DBR mirror 3 by the optical resonator formed between the HR film 1a and the DBR mirror 3. Only the FP mode whose transmittance is the highest within a pass-band of the ring modulator 2 selectively oscillates in a single longitudinal mode among the existing plurality of FP modes by the ring modulator 2 being the light wavelength filter having the band-pass characteristics disposed in the optical resonator. The oscillation light is intensity-modulated by inputting a modulation signal to the ring modulator 2 because coupling efficiency to the output port of the optical waveguide 11b is changed, and the oscillation light is output from the output port of the optical waveguide 11b.

A digital modulation signal which changes between the voltage $V_0$ and the voltage $V_1$ is applied to the modulation electrodes 2a, 2b of the ring modulator 2, and thereby, it is possible to generate modulation in accordance with a modulation signal intensity at the resonant wavelength. It is thereby possible to modulate a transmittance $T_{out}$ at an oscillation light wavelength to the output port. A power $P_{out}$ of output light is equal to a product $P_r T_{out}$ of a light power $P_r$ in the optical resonator and the transmittance $T_{out}$, and therefore, the optical resonator whose variation of the $P_r$ is suppressed is designed, and thereby, it is possible to apply a modulation to the $P_{out}$ in accordance with the modulation signal.

Figure 2:
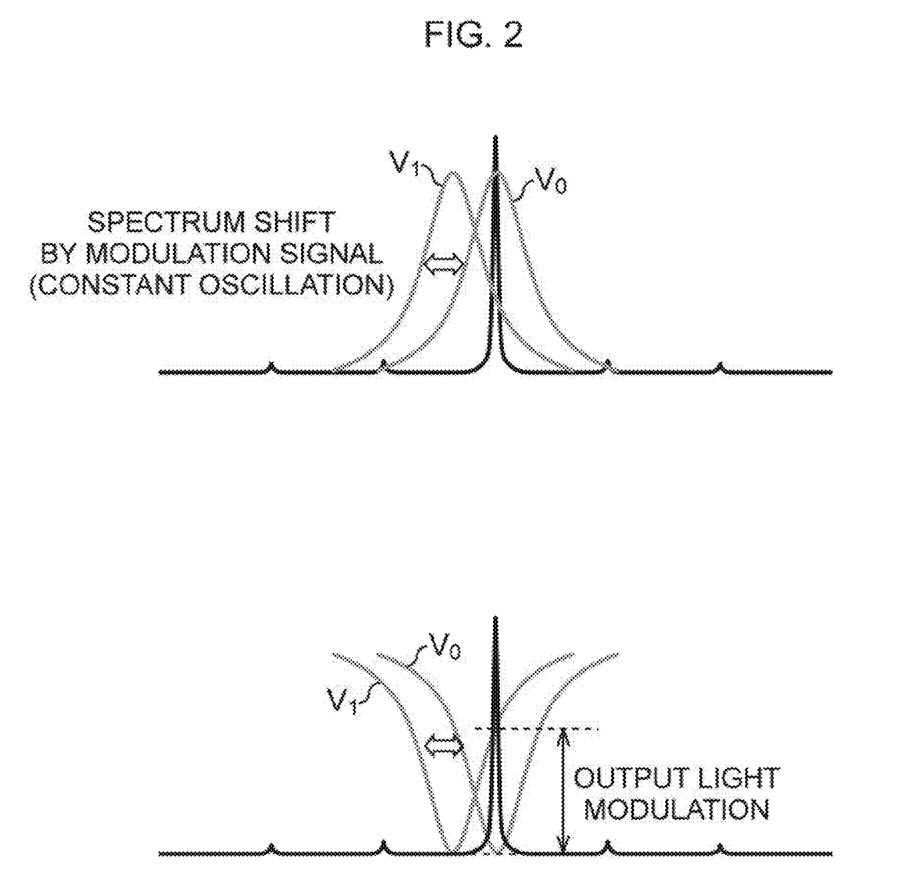
FIG. 2 is a characteristic chart illustrating a relation between a spectrum of a resonant wavelength and a spectrum of oscillation light in a case when the resonant wavelength is coincide with an oscillation light wavelength at a voltage $V_0$.

In the modulated light source, it is possible to obtain the output light with high extinction ratio by making a resonant wavelength (a center wavelength of a spectrum of the resonant wavelength) coincide with the oscillation light wavelength when the modulation signal applied to the modulation electrodes 2a, 2b is at the voltage $V_0$ or the voltage $V_1$. In FIG. 2, a relation between a spectrum of the resonant wavelength and a spectrum of the oscillation light is illustrated in a case when the resonant wavelength is made to coincide with the oscillation light wavelength at the voltage $V_0$. The resonant wavelength of the ring modulator 2 and the oscillation light wavelength of the FP mode are not always made to coincide with the resonant wavelength at the voltage $V_0$ or the voltage $V_1$ in an initial state due to existences of a fabrication variation and a temperature-dependent variation. Hereinafter, a wavelength shift amount necessary for making these coincide with each other will be described.

Figure 3A:
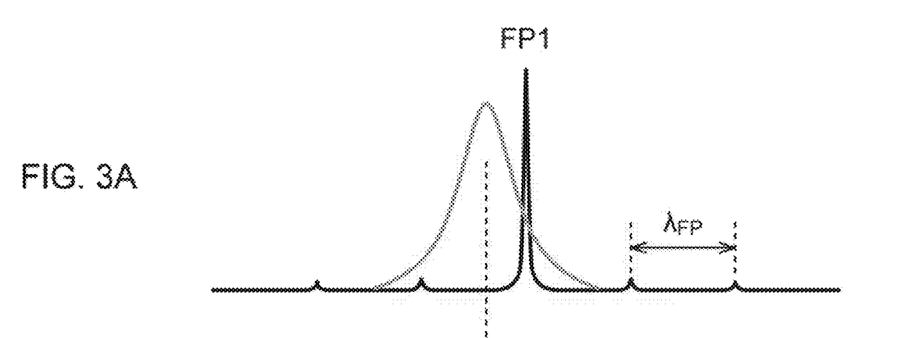
FIG. 3A and FIG. 3B are characteristic charts each illustrating a state where an initial wavelength deviation is compensated.
Figure 4A:
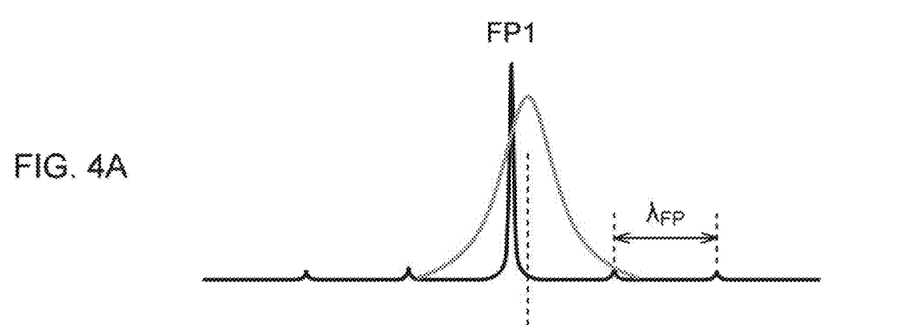
FIG. 4A and FIG. 4B are characteristic charts each illustrating a state where a wavelength deviation is compensated.

The FP mode where the light oscillation occurs exists in the pass-band of the ring modulator 2. At this time, two cases are conceivable, namely a case when the resonant wavelength is at a short wavelength side than the FP mode where the light oscillation occurs (hereinafter, referred to as FP1) (FIG. 3A) or a case when it is at a long wavelength side (FIG. 4A).

Figure 3B:
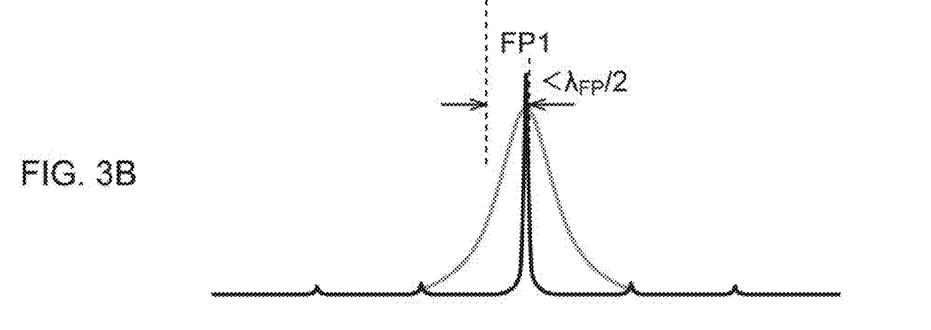

When the resonant wavelength is at the short wavelength side than the FP1, a current is passed in the heater 6 of the ring modulator 2 to shift the resonant wavelength toward the long wavelength side, and thereby, it is possible to make the resonant wavelength coincide with the FP1. A shift amount of the resonant wavelength at this time becomes $P_{FP}/2$ or less (FIG. 3B) when a power of the heater 6 necessary for the wavelength shift of an FP mode spacing ($\lambda_{FP}$) is defined as $P_{FP}$. This is because the FP1 is the nearest to the initial resonant wavelength among the plurality of FP modes, and therefore, the shift amount of the resonant wavelength is a half or less of the FP mode spacing $\lambda_{FP}$.

Figure 4B:
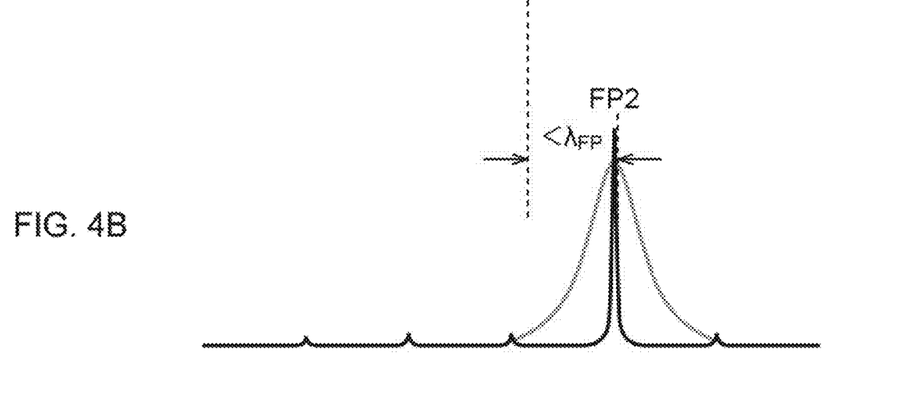

When the resonant wavelength is at the long wavelength side than the FP1, the light oscillation in the FP mode where the light oscillation occurs stops, and a light oscillation in an FP mode existing adjacent to the FP mode at the long wavelength side (hereinafter, referred to as FP2) starts (FIG. 4B) according to the long wavelength side shift of the resonant wavelength resulting from the current passed in the heater 6 of the ring modulator 2. The resonant wavelength at this time exists at the short wavelength side than the FP2, and therefore, it is possible to make the resonant wavelength coincide with the FP2 by further increasing the current. The wavelength shift amount at this time is the FP mode spacing $\lambda_{FP}$ or less, and therefore, the power consumption of the heater 6 is warranted to be the $P_{FP}$ or less.

As stated above, it is possible to compensate the initial wavelength deviation with the power consumption of the $P_{FP}$ or less in either case when the resonant wavelength exists at the short wavelength side and at the long wavelength side than the FP1.

Figure 5A:
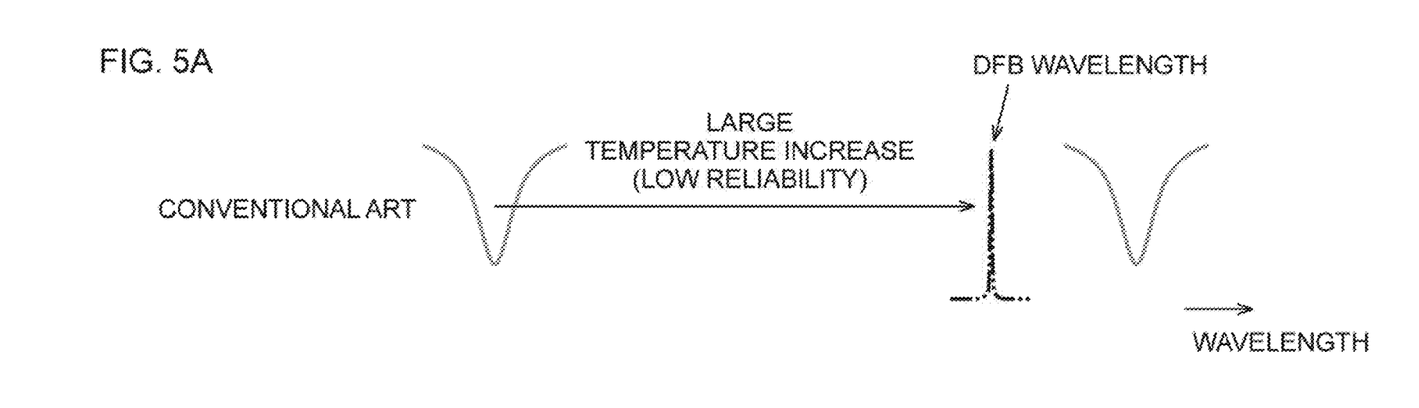
FIG. 5A and FIG. 5B are characteristic charts each illustrating a state of a temperature increase when compensation of the wavelength deviation is performed by a heater.

In case of the ring modulator 2 using the optical waveguide of the silicon thin line, it is possible to decrease the ring radius r to approximately 5 µm, and it is possible to enable reduction in the modulation power, and the power consumption of the heater 6 in accordance with the decrease in the ring radius. When the ring radius is made smaller than 5 µm, a bending loss of the ring modulator 2 becomes a problem. When the ring radius is set to be 5 µm being a limit, a maximum ring resonant wavelength spacing (FSR) is approximately 19 nm. Therefore, according to the conventional art, a wavelength deviation compensation of approximately 19 nm is necessary at the maximum as illustrated in FIG. 5A.

Figure 5B:
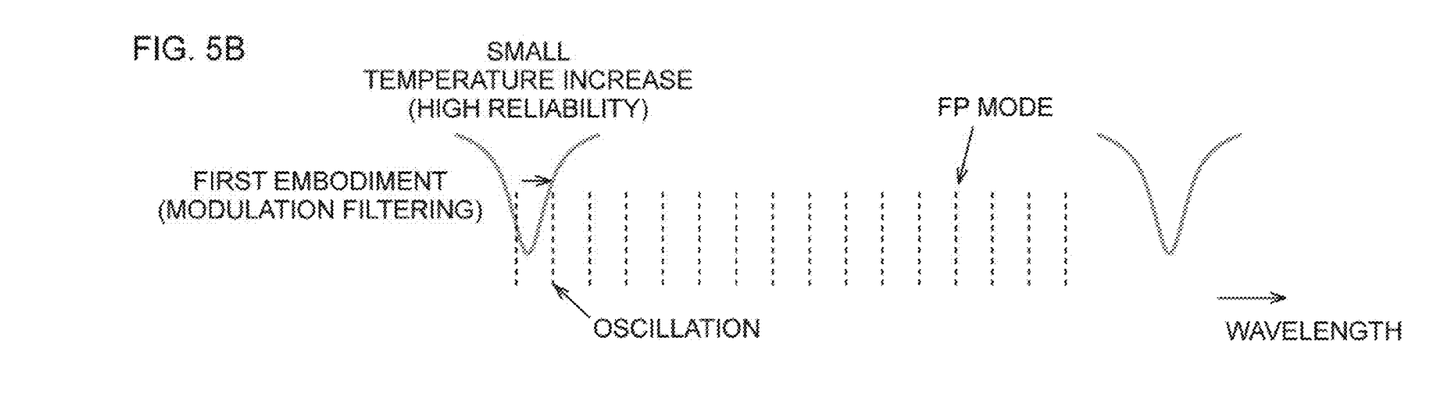
Figure 6:
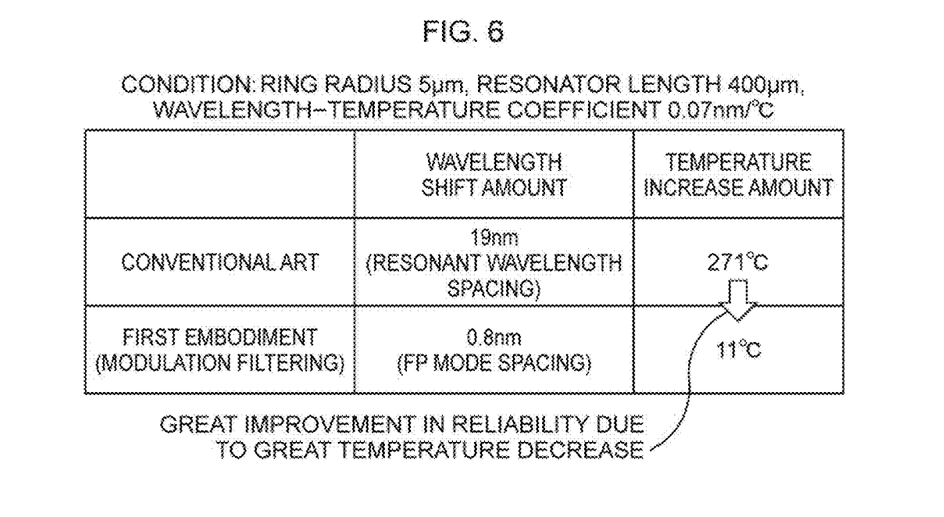
FIG. 6 is a table illustrating a wavelength shift amount and a temperature increase amount when the compensation of the wavelength deviation is performed by the heater.

On the other hand, in the present embodiment, an optical resonator length is set to be approximately 400 µm, and thereby, the FSR becomes approximately 0.8 nm. In this case, as illustrated in FIG. 5B, the wavelength deviation compensation is 0.8 nm at the maximum. When it is converted into a temperature by using a wavelength temperature coefficient 0.07 nm/K at the optical waveguide of the silicon thin line, as illustrated in FIG. 6, a temperature increase of 271° C. is necessary in the conventional art. On the other hand, in the present embodiment, the temperature increase of only 11.4° C. is enough, and it is possible to greatly improve reliability as compared with the conventional art. Similarly, the power consumption of the heater is also reduced to approximately 0.8 nm/19 nm×100≈4.2%.

Figure 7:
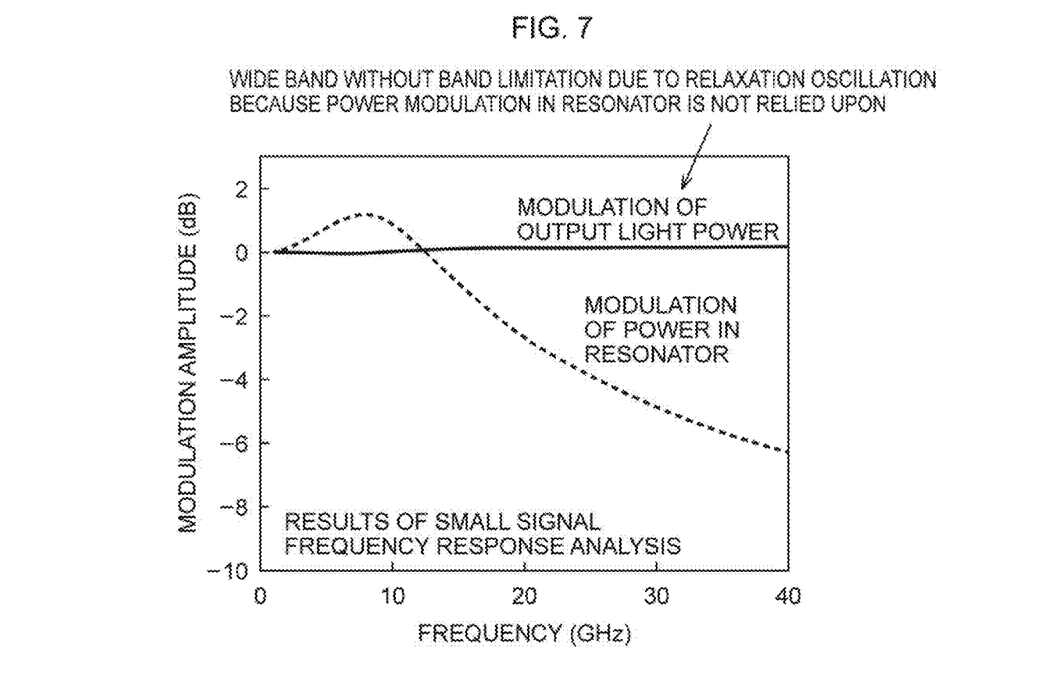
FIG. 7 is a characteristic chart illustrating results when frequency characteristics of a modulation amplitude of a modulation signal are analyzed by a small-signal analysis.

In FIG. 7, results when frequency characteristics of a modulation amplitude of a modulation signal in the present embodiment are analyzed by a small-signal analysis, are illustrated. The modulation of the power in the optical resonator receives a band limitation due to a relaxation oscillation similar to a direct modulation of a semiconductor laser, and there is only a 3 dB band of approximately 10 several GHz. On the other hand, the modulation of the output light power does not necessarily require the modulation of the power in the resonator, and it is modulated without lowering of amplitude even in a vicinity of 40 GHz where the modulation of the power in the optical resonator becomes approximately −6 dB. The above-stated calculation results are on an assumption that modulation characteristics of the ring modulator are flat in the above-stated calculation area. However, in general, it is possible to make the modulation characteristics of the ring modulator wide band compared to the band limitation due to the relaxation oscillation, and a ring modulator having a flat characteristic at the above-stated calculation area is reported.

Example

Hereinafter, a concrete example of the modulated light source according to the present embodiment will be described.

In this example, a III-V group semiconductor such as an InP is used as a gain chip, and an HR film is formed by applying an HR coating with a reflective index of 98% on one end surface, and an AR film is formed by applying an AR coating on the other end surface. The gain chip has a length of approximately 300 µm, is flip-mounted on a terrace fabricated on an SOI substrate, and is butt-joint connected to a silicon sub-micron optical waveguide fabricated by processing an SOI layer of the SOI substrate. An optical coupling is thereby enabled. In the optical waveguide of the silicon thin line being an optical coupling destination, a ring modulator whose radius is approximately 5 µm, namely, whose half circumferential length is approximately 16 µm is provided, another optical waveguide (with a length of approximately 20 µm) is provided in addition to the optical waveguide which is connected to a butt-joint part, and a DBR mirror with a reflective index of 97% is formed at one end by a diffraction grating. At the other end, a light power monitor PD is provided, and a wavelength controller is connected to the light power monitor PD. An output current of a heater provided at the ring modulator is controlled by the wavelength controller. In the optical waveguide connected to the butt-joint part, a length from the butt-joint part to a position which is in contact with the ring is set to be approximately 64 µm.

In the above-stated case, an optical resonator length becomes 300 µm+16 µm+20 µm+64 µm=approximately 400 µm, and the FP mode spacing becomes 100 GHz (=approximately 0.8 nm). At this time, a ring resonance half value width is set to be 50 GHz, and thereby, it becomes possible to enable the selective light oscillation in only one mode among the FP modes, and to secure a modulation band of the ring modulator up to approximately 50 GHz.

Figure 8:
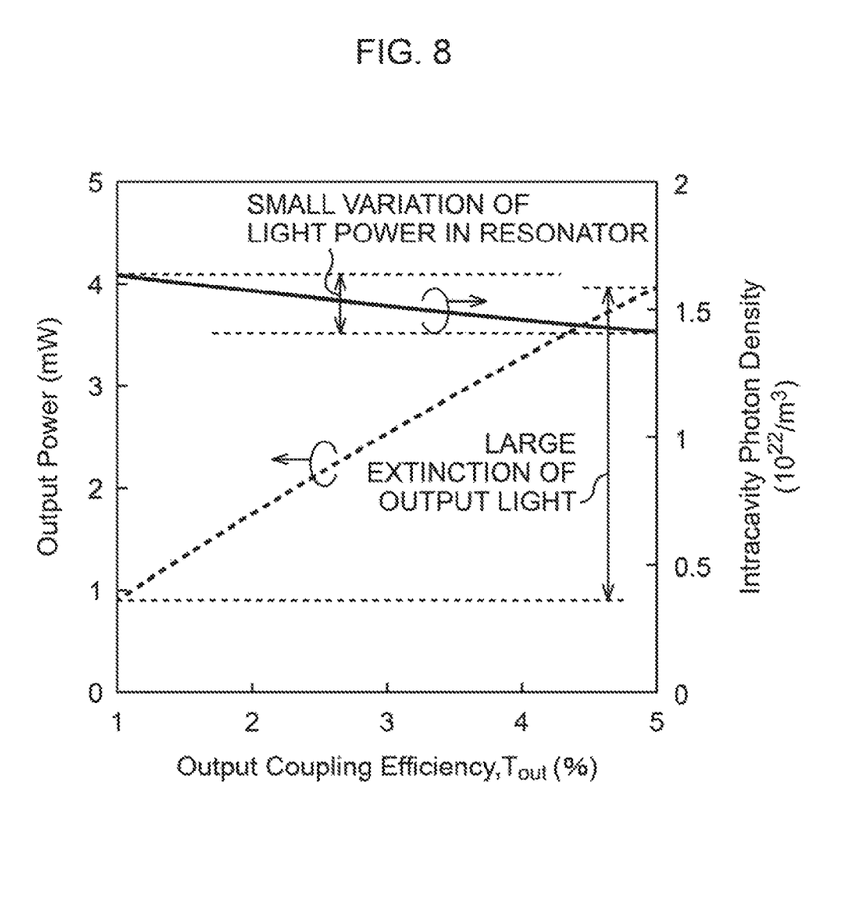
FIG. 8 is a characteristic chart illustrating results when static characteristics of a power change of output light are calculated in a modulated light source according to an example.

In FIG. 8, results when static characteristics of a power change of output light are calculated when the transmittance $T_{out}$ to the output port at the oscillation light wavelength is modulated within a range of 1% to 5% in the modulated light source according to the example, are illustrated. Various conditions of the calculation relating to the gain chip are as follows.

non-radiative recombination lifetime τ=1 ns
transparent carrier density No=6×10$^{18}$/cm$^3$
non-oscillation carrier density N$_{S+0}$=6×10$^{18}$/cm$^3$
optical confinement coefficient Γ=25%
derivative gain dg/dN=4×10$^{16}$/cm$^2$
mode area A$_{mode}$=1 μm$^2$ The transmittance T$_{out}$ is modulated within the range of 1% to 5% by using the modulated light source according to the example, and thereby, it can be seen that it is possible to suppress a light power variation in the optical resonator within a small range of approximately 3.5 mW to 4 mW and to largely modulate the output light power between approximately 1 mW to 4 mW.

As it is described hereinabove, according to the present embodiment, the excellent and minute modulated light source is enabled in which both requirements of securing the reliability of the modulated light source and improving the power efficiency of the wavelength adjustment mechanism are satisfied and in which the problem caused by using the DFB laser and so on does not occur.

The position of the light power monitor PD 4 is not limited to the position in FIG. 1, but may be at any position of the optical waveguide at in and outside of an LD resonator.

(Second Embodiment)

Next, a second embodiment is described. In the present embodiment, a modulated light source is disclosed as same as the first embodiment, but it is different from the first embodiment in a point that it is a multi-wavelength modulated light source.

Figure 9:
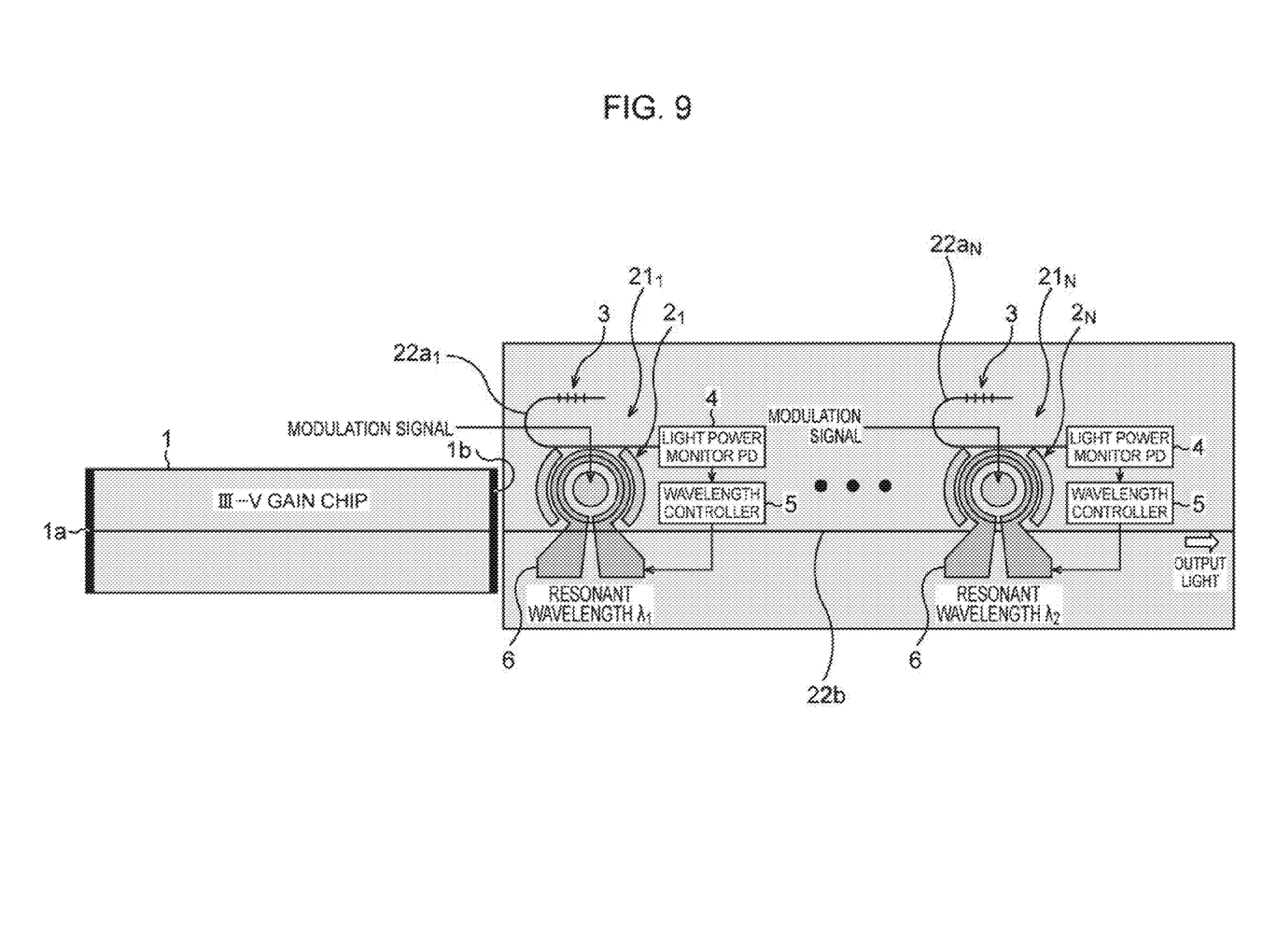
FIG. 9 is a schematic view illustrating a schematic configuration of a modulated light source according to a second embodiment.

FIG. 9 is a schematic view illustrating a schematic configuration of the modulated light source according to the second embodiment. The same reference numerals and signs as FIG. 1 are applied as for composing members and so on corresponding to the first embodiment, and detailed description thereof is not given.

This modulated light source is constituted by including a gain chip 1 being an optical amplifier and a plurality of light modulation units 21$_1$ to 21$_N$ (N≥2).

The light modulation unit 21$_k$ (1≤k≤N) is constituted by including a ring modulator 2$_k$ being a light wavelength filter, a DBR mirror 3 being a light reflection mechanism, a light power monitor PD 4 being a detection part of a light power, a wavelength controller 5, and a heater 6.

The ring modulators 2$_1$ to 2$_N$ include, for example, N pieces of optical waveguides 22$a_1$ to 22$a_N$, and a piece of optical waveguide 22$b$ each constituted by the silicon thin line. In each of the optical waveguides 22$a_1$ to 22$a_N$, the DBR mirror 3 is disposed at one end, and the light power monitor PD 4 is disposed at the other end. In the optical waveguide 22$b$, one end is an output port of an optical signal, and the other end is connected (butt-joint connected) to the gain chip 1.

In the modulated light source according to the present embodiment, laser oscillations occur in a plurality of FP modes each having a wavelength spacing determined by each of optical path lengths between an HR film 1$a$ of the gain chip 1 and the DBR mirrors 3 by optical resonators formed between the HR film 1$a$ and the DBR mirrors 3. N pieces of ring modulators 2$_1$ to 2$_N$ each having band-pass characteristics are provided in the optical resonators. The ring modulators 2$_1$ to 2$_N$ respectively have different resonant wavelengths λ$_1$, λ$_2$, . . . , λ$_N$, and there is a transmission peak in a vicinity of each of the resonant wavelengths λ$_1$, λ$_2$, . . . , λ$_N$. Accordingly, it is possible for the respective DBR mirrors 3 of the ring modulators 2$_1$ to 2$_N$ to feed back only lights in the vicinity of the respective resonant wavelengths λ$_1$, λ$_2$, . . . , λ$_N$ to the gain chip 1. It is thereby possible to oscillate the FP modes in the vicinity of the resonant wavelengths λ$_1$, λ$_2$, . . . , λ$_N$ and simultaneously apply intensity-modulation. The multi-wavelength modulated light source is enabled by the above-stated constitution.

As it is described hereinabove, according to the present embodiment, the excellent, minute, and multi-wavelength modulated light source is enabled in which both requirements of securing the reliability of the modulated light source and improving the power efficiency of the wavelength adjustment mechanism and the modulation are satisfied, and in which the problem caused by using the DFB laser and so on does not occur.

The position of the light power monitor PD 4 is not limited to the position in FIG. 9, but may be at any position of the optical waveguide in and outside of the LD resonator.

(Third Embodiment)

Next, a third embodiment is described. In the present embodiment, a modulated light source is disclosed as same as the first embodiment, but it is different from the first embodiment in a point that it is a multi-wavelength modulated light source.

Figure 10:
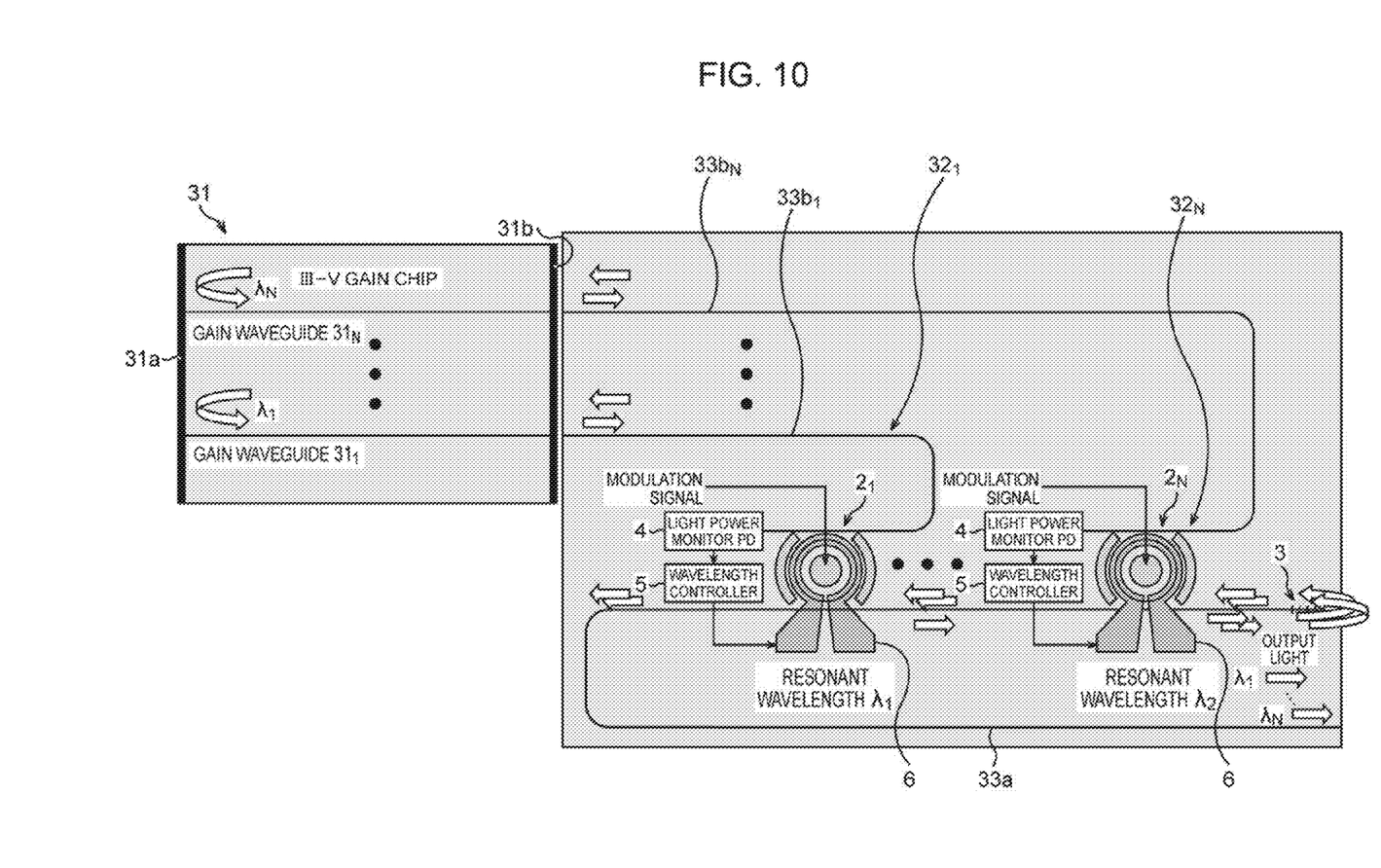
FIG. 10 is a schematic view illustrating a schematic configuration of a modulated light source according to a third embodiment.

FIG. 10 is a schematic view illustrating a schematic configuration of the modulated light source according to the third embodiment. The same reference numerals and signs as FIG. 1 are applied as for composing members and so on corresponding to the first embodiment, and detailed description thereof is not given.

This modulated light source is constituted by including a gain chip 31 being an optical amplifier and a plurality of light modulation units 32$_1$ to 32$_N$ (N≥2).

The gain chip 31 is constituted by, for example, a III-V group semiconductor such as an InP, and a plurality of gain waveguides 31$_1$ to 31$_N$ are adjacently disposed, a reflective (HR) film 31$a$ is formed at one end, and an anti-reflective (AR) film 31$b$ is formed at the other end in each of them. The gain waveguides 31$_1$ to 31$_N$ are respectively connected (butt-joint connected) to the light modulation units 32$_1$ to 32$_N$.

The light modulation unit 32$_K$ (1≤k≤N) is constituted by including a ring modulator 2$_k$ being a light wavelength filter, a light power monitor PD 4 being a detection part of a light power, a wavelength controller 5, and a heater 6. A common DBR mirror 3 is provided for the light modulation units 32$_1$ to 32$_N$.

The ring modulators 2$_1$ to 2$_N$ include, for example, a piece of optical waveguide 33$a$, and N pieces of optical waveguides 33$b_1$ to 33$b_N$ each constituted by a silicon thin line. In the optical waveguide 33$a$, the common DBR mirror 3 is disposed at one end, and the other end is an output port of an optical signal. In each of the optical waveguides 33$b_1$ to 33$b_N$, one end is connected (butt-joint connected) to each of the gain waveguides 31$_1$ to 31$_N$ of the gain chip 31, and the light power monitor PD 4 is disposed at the other end.

In the modulated light source according to the present embodiment, laser oscillations occur in a plurality of FP modes each having a wavelength spacing determined by each of optical path lengths between the HR films 31$a$ of the gain waveguides 31$_1$ to 31$_N$ and the DBR mirror 3 by the optical resonators constituted between the HR films 31$a$ and the DBR mirror 3. N pieces of ring modulators 21$_1$ to 21$_N$ each having band-pass characteristics are provided in each of the optical resonators so as to correspond to each of the optical resonators. The ring modulators 21$_1$ to 21$_N$ respectively have different resonant wavelengths λ$_1$, λ$_2$, . . . , λ$_N$, and there is a transmission peak in a vicinity of each of the resonant wavelengths λ$_1$, λ$_2$, . . . , λ$_N$. Accordingly, it is possible for the DBR mirror 3 to feed back only lights in the vicinity of the resonant wavelengths $\lambda_1, \lambda_2, \ldots, \lambda_N$ to the gain waveguides $31_1$ to $31_N$. It is thereby possible to oscillate the FP modes in the vicinity of the resonant wavelengths $\lambda_1, \lambda_2, \ldots, \lambda_N$ and simultaneously apply intensity-modulation. In the present embodiment, the different gain waveguides $31_1$ to $31_N$ are used for the respective resonant wavelengths $\lambda_1, \lambda_2, \ldots, \lambda_N$, and thereby, the multi-wavelength modulated light source is enabled under a stable oscillation state.

The positions of the light power monitors PD 4 are not limited to the positions in FIG. 10, but they may be at any positions of the optical waveguides in and outside of the LD resonators.

As it is described hereinabove, according to the present embodiment, it is possible to enable the excellent, minute, and multi-wavelength modulated light source in which both requirements of securing the reliability of the modulated light source and improving the power efficiency of the wavelength adjustment mechanism and modulation are satisfied, and in which the problem caused by using the DFB laser and so on does not occur.

Note that in the above-stated first to third embodiments, the ring modulator is exemplified as the light wavelength filter having the band-pass characteristics, but it is not limited thereto, and it may be, for example, just a diffraction grating. It may also be a Cascaded Mach-Zehnder, an Arrayed Waveguide Grating (AWG), an Echelle Grating, and one in which the band-pass characteristics are made to be steeper by coupling a plurality of ring modulators. Besides, any light wavelength filter is applicable as long as it is a light wavelength filter having the band-pass characteristics capable of modulating a transmission wavelength.

Besides, the DBR mirror formed by the diffraction grating is exemplified as the light reflection mechanism, but it is not limited thereto, and it may be one having a reflective property within a wide wavelength range enough to cover a wavelength variation of the light wavelength filter having the band-pass characteristics. For example, a loop mirror, a reflecting mirror using an optical waveguide end surface, or one whose reflection is enhanced by forming a metal film or a dielectric multilayer film on the optical waveguide end surface may be used.

Besides, the heater is exemplified as a part of the wavelength adjustment mechanism, but it is not limited thereto, and a system passing a current in a forward direction to a PN or PIN junction may be applied similar to the light wavelength filter. In this case, the ring modulator is divided into two, and one of them is used as an intensity modulating region including a first modulation electrode which modulates a resonant wavelength according to its intensity by a modulation signal, and the other is used as a wavelength adjustment region including a second modulation electrode to which a control signal of a wavelength modulation is input.

According to the above-stated aspects, an excellent and minute modulated light source in which both requirements of securing reliability of the modulated light source and improving power efficiency of a wavelength adjustment mechanism and modulation are satisfied, and in which a problem caused by using a DFB laser and so on does not occur is enabled.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A modulated light source comprising:
    an optical amplifier which includes a reflective film at one end;
    a light wavelength filter which has band-pass characteristics and modulates a transmission center wavelength;
    a light reflection mechanism which feeds back light having passed through the light wavelength filter to the optical amplifier and an optical resonator is formed between which and the reflective film; and
    a wavelength adjustment mechanism which adjusts the transmission center wavelength to coincide with a specific oscillation wavelength when light oscillation selectively occurs at the specific oscillation wavelength depending on the band-pass characteristics of the light wavelength filter,
    wherein the light wavelength filter is a ring modulator including a P-type doping region and an N-type doping region in a ring-state optical waveguide, and a modulation electrode applying a reverse bias voltage or a forward bias voltage between the P-type doping region and the N-type doping region in accordance with a modulation signal.

2. The modulated light source according to claim 1, wherein the light wavelength filter has a transmission band in which the specific oscillation wavelength is selected from among a plurality of oscillation wavelengths each having a wavelength spacing determined by an optical path length of the resonator and light oscillation occurs at the specific oscillation wavelength.

3. The modulated light source according to claim 1, wherein the wavelength adjustment mechanism includes:
    a detection part which detects a light power at the optical resonator; and a control part which outputs a control signal corresponding to an adjustment amount of the transmission center wavelength to make the transmission center wavelength coincide with the specific oscillation wavelength based on the light power detected by the detection part.

4. The modulated light source according to claim 3, wherein the wavelength adjustment mechanism includes a heater part which heats the light wavelength filter in accordance with the control signal.

5. The modulated light source according to claim 1, wherein the light wavelength filter is a ring modulator including a first modulation electrode which modulates the resonant wavelength based on a modulation signal in accordance with an intensity of the modulation signal.

6. The modulated light source according to claim 3, wherein the light wavelength filter is a ring modulator including a first modulation electrode which modulates the resonant wavelength based on a modulation signal in accordance with an intensity of the modulation signal and a second modulation electrode to which the control signal is input.

7. The modulated light source according to claim 1, wherein the light wavelength filter has two kinds of optical waveguides:

one of the optical waveguides corresponds to the light wavelength filter and the light reflection mechanism is disposed at one end; and one end of the other of the optical waveguides is an output port and the other end is connected to the optical amplifier.

8. The modulated light source according to claim 1, further comprising:

a plurality of light modulation units which each include a light wavelength filter, a light reflection mechanism, and a wavelength adjustment mechanism, wherein in the plurality of light modulation units, the resonant wavelengths of the respective light wavelength filters are set to different values, and the respective wavelength adjustment mechanisms adjust the respective resonant wavelengths to coincide with a plurality of specific oscillation wavelengths when light oscillations selectively occur at the plurality of specific oscillation wavelengths depending on the band-pass characteristics of the respective light wavelength filters.

9. The modulated light source according to claim 1, further comprising:

a plurality of light modulation units which each include a light wavelength filter and a wavelength adjustment mechanism, wherein in the plurality of light modulation units, the optical amplifier includes a plurality of optical amplification waveguides;

each light wavelength filter corresponds to each optical amplification waveguide and the resonant wavelengths are set to different values; and the respective wavelength adjustment mechanisms adjust the respective resonant wavelengths to coincide with a plurality of specific oscillation wavelengths when light oscillations selectively occur at the plurality of specific oscillation wavelengths depending on the band-pass characteristics of the respective light wavelength filters.

10. The modulated light source according to claim 9, wherein the light reflection mechanism is provided in common to the plurality of light modulation units.

11. The modulated light source according to claim 9, wherein each light wavelength filter has two kinds of optical waveguides;

the light reflection mechanism is disposed at one end of one of the optical waveguides, and the other end is an output port; and the other of the optical waveguides corresponds to each of the light wavelength filters, and one end of the optical waveguide is connected to each optical amplification waveguide.

* * * * *